(12) United States Patent
Cobbley et al.

(10) Patent No.: US 6,353,268 B1
(45) Date of Patent: Mar. 5, 2002

(54) SEMICONDUCTOR DIE ATTACHMENT METHOD AND APPARATUS

(75) Inventors: Chad A. Cobbley; Tongbi Jiang; Ed A. Schrock, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/274,128

(22) Filed: Mar. 22, 1999

Related U.S. Application Data

(62) Division of application No. 08/916,629, filed on Aug. 22, 1997.

(51) Int. Cl.[7] ................................................ H01L 23/28
(52) U.S. Cl. ...................... 257/796; 257/676; 257/673; 257/783; 438/118
(58) Field of Search ................................. 257/673, 676, 257/666, 690, 707, 729, 782, 783, 795; 438/118, 119

(56) References Cited

U.S. PATENT DOCUMENTS

| | | |
|---|---|---|
| 2,628,178 A | 2/1953 | Burnett et al. |
| 3,832,334 A | 8/1974 | O'Sullivan et al. |
| 3,987,019 A | 10/1976 | Gruber et al. |
| 4,209,358 A | 6/1980 | DiLeo et al. |
| 4,295,909 A | 10/1981 | Baccei ........................ 156/307 |
| 4,309,526 A | 1/1982 | Baccei ........................ 528/75 |
| 4,490,515 A | 12/1984 | Mariotti et al. |
| 4,533,422 A | 8/1985 | Litke |
| 4,793,887 A | 12/1988 | Card et al. |
| RE32,889 E | 3/1989 | Litke ........................... 523/212 |
| 5,079,098 A | 1/1992 | Liu ............................. 428/522 |
| 5,150,195 A | 9/1992 | Nguyen |
| 5,175,337 A | 12/1992 | Mikuni et al. |

(List continued on next page.)

OTHER PUBLICATIONS

Loctite, product description sheet for 410, Rocky Hill, CT, Oct. 1996.*
Loctite, product description sheet for 416, Rocky Hill, CT, Oct. 1998.*
Chorbadjiev, K. G. and Kotzev, D. L., "The effect of fillers upon the properties of electroconductive cyanoacrylate adhesives", Int. J. Adhesion and Adhesives, vol. 8, No. 3, Jul. 1988, pp. 143–146.
Melody, David P., "Advances in Room Temperature Curing Adhesives and Sealants—A Review", British Polymer Journal, vol. 21, No. 2, 1989, Printed in Great Britain, pp. 175–179.
Loctite, product description sheet, Rocky Hill, CT., Dec. 1996.
Loctite Corporation, "VARIDOT™ Surface Mount Adhesive Printing Process", advertising brochure, Rocky Hill, CT.

(List continued on next page.)

*Primary Examiner*—Olik Chaudhuri
*Assistant Examiner*—Ginette Peralta
(74) *Attorney, Agent, or Firm*—Stephen A. Gratton

(57) ABSTRACT

A method for attaching a semiconductor die to a leadframe is provided. Also provided are an improved semiconductor package, and a system for performing the method. The method includes applying an instant curing adhesive, such as a cyanoacrylate monomer or anaerobic adhesive, to the leadframe or die, and then polymerizing the adhesive at room temperature and ambient atmosphere, to form a cured adhesive layer between the die and lead frame. A catalyst can be applied to the leadframe, to the die or to the adhesive, to initiate polymerization. In addition, fillers can be added to the adhesive to improve various electrical and physical characteristics of the resultant adhesive layer. The system includes a dispensing mechanism for dispensing the instant curing adhesive on the leadframe or die, and a die attach mechanism for positioning and placing the die in contact with the dispensed adhesive.

23 Claims, 2 Drawing Sheets

U.S. PATENT DOCUMENTS

| | | | |
|---|---|---|---|
| 5,288,794 A | 2/1994 | Attarwala | 524/714 |
| 5,328,944 A | 7/1994 | Attarwala et al. | 524/83 |
| 5,386,047 A | 1/1995 | Nakos et al. | 556/416 |
| 5,424,343 A | 6/1995 | Attarwala | 524/83 |
| 5,536,799 A | 7/1996 | Takahashi et al. | 526/298 |
| 5,589,554 A | 12/1996 | Hiraoka | 525/530 |
| 5,656,945 A | 8/1997 | Cain | |
| 5,739,205 A | 4/1998 | Nishino et al. | |
| 5,834,836 A | 11/1998 | Park et al. | |
| 5,861,678 A | 1/1999 | Schrock | 257/783 |
| 5,893,726 A * | 4/1999 | Farnworth et al. | 438/108 |

OTHER PUBLICATIONS

Millet, George H., "Properties of Cyanoacrylates—an Overview", Adhesives Age, Oct. 1981, pp. 27–32.

Microelectronics Packaging Handbook, 1989, pp. 554–557.

Pepper, D. C., Kinetics and Mechanisms of Zwitterionic Polymerizations, Polymer Journal, vol. 12, No. 9, pp. 629–637 (1980).

VanZant, Peter, *Microchip Fabrication*, Second Edition, 1990, pp. 485–487.

Vijayalakshmi, V. et al., "Synthesis of 3–Substituted–2–cyanoacrylates: Their Evaluation as Cross–linkers in Cyanoacrylate Adhesive Compositions", Journal of Applied Polymer Science, vol. 49. 1993, pp. 1387–1394.

Palmer, Bentley J. et al., A New Photoinitiator for Anionic Polymerization, *Macromolecules*, 1995, pp. 1328–1329.

Negulescu, Ioan I. et al., Thermal Behavior of Poly($\alpha$Cyanoacrylates)S, J. Maromol. Sci–Chem, A24 (1), 1987, pp. 75–83.

O'Connor, John T. and Attarwala, Shabbir, "Recent Breakthroughs in Thermal Resistant Cyanoacrylate Instant Adhesives", technical paper, Society of Manufacturing Engineers, 1993.

Drain, K. F., et al., The effect of moisture on the strength of polycarbonate–cyanoacrylate adhessive bonds, Int. J.Adhesion and Adhesives, Jul. 1985, pp. 133–136.

Rooney, John M., Thermal Degredation of Methyl and Ethyl Cyanoacrylate Oligomers, The British Polymer Journal, Dec. 1981, pp. 160–163.

Lee, Ju–Yeon, Synthesis and Ring–Opening Polymerization of 3–Methoxy–4–cyano–2, 9–dioxabicyclo[4.3.0] non–3–ene: Preparationof Alternating Head–to–Head Copolymer of Methyl $\alpha$–cyanoacrylate and 2,3–Dihydrofuran, Journal of Polymer Science: vol. 27, 1989, pp. 85–91.

Cooke, B. D. and Allen, K. W., "Cyanoacrylates and their acid values", Int. J. Adhesion and Adhesives, vol. 13 No. 2, Apr. 1993, pp. 73–76.

Ito, Hiroshi, Thermal Deesterification and Decarboxylation of Alternating Copolymers of Styrene with $\beta$–Substituted t–Butyl $\alpha$–Cyanoacrylates, Journal of Polymer Science, vol. 27, 1989, pp. 2871–2881.

Stein, Michael, Thermal Behavior of Various Poly (2–Cyanoacrylate)S, Journal of Applied Poly Science: (1991), pp. 441–447.

Mikuni, Hiroyuki et al., "Morphological Study of Cyanoacrylate Adhesive Modified by Poly(butaduene–co–acrylonitrile)", Polym. Network Blends, 5(3), 1995, pp. 159–162.

Okamoto, Y. and Klemarczyk, P. T., "Bonding Non–Polar Plastics with Alkyl Cyanoacrylate Instant Adhesive", ANTEC '91, pp. 1114–1116.

Denchev, Z. Z. and Kabaivanov, V. S., "Thermal Behaviour and Adhesive Properties of Some Cyanoacrylate Adhesives with Increased Heat Resistance", Journal of Applied Polymer Science, vol. 47, pp. 1019–1026 (1993).

U.S. application No. 09/651,217, Cobbley et al., filed Aug. 30, 2000.

U.S. application No. 09/065,944, Cobbley et al., filed Apr. 24, 1998.

* cited by examiner

| PROVIDING A CONVENTIONAL SEMICONDUCTOR DIE AND LEADFRAME, STEP A. |
|---|
| DISPENSING AN INSTANT CURING ADHESIVE MATERIAL ON THE LEADFRAME (OR ALTERNATELY ON THE DIE), STEP B. |
| PLACING THE DIE IN CONTACT WITH THE ADHESIVE MATERIAL, STEP C. |
| POLYMERIZING THE ADHESIVE MATERIAL TO FORM A CURED ADHESIVE LAYER AND BOND THE DIE TO THE LEADFRAME, STEP D. |

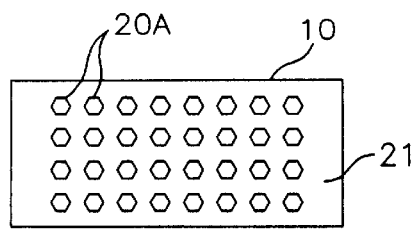
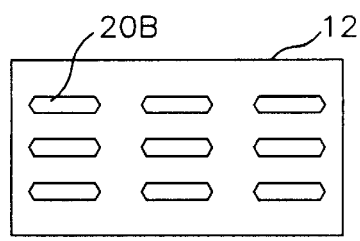
FIGURE 3A
FIGURE 3B
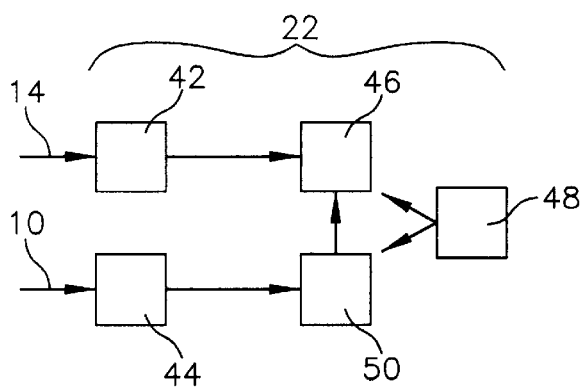
FIGURE 4
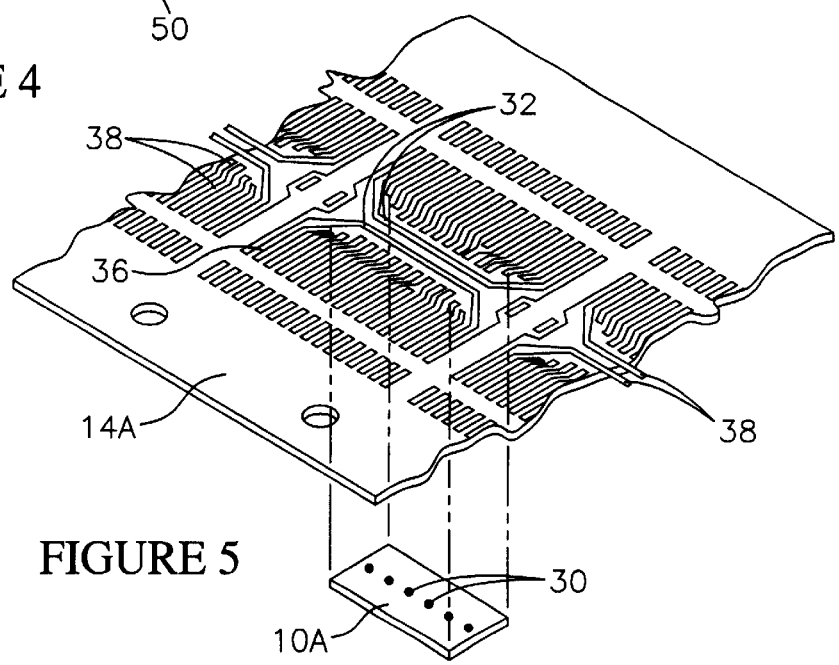
FIGURE 5
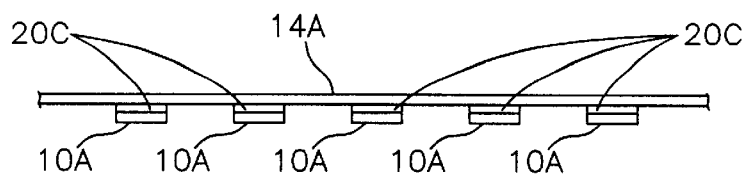
FIGURE 6

SEMICONDUCTOR DIE ATTACHMENT METHOD AND APPARATUS

CROSS REFERENCE TO RELATED APPLICATIONS

This application is a division of application Ser. No. 08/916,629, filed on Aug. 22, 1997.

FIELD OF THE INVENTION

This invention relates to a method and system for attaching semiconductor dice to a leadframe, and more particularly to such a method and system wherein an instant curing adhesive, such as cyanoacrylate is utilized to bond the dice to the leadframe.

BACKGROUND OF THE INVENTION

A conventional semiconductor package is formed by attaching several semiconductor dice to a metal leadframe. The leadframe comprises a metal strip that supports the dice for packaging and provides the leads in the completed packages. One type of leadframe includes several mounting paddles for attaching each die to the leadframe. Each paddle has a peripheral configuration which corresponds to the peripheral configuration of a semiconductor die. The leadframe also includes lead fingers that can be wire bonded to the bond pads on the dice. Following attachment and wire bonding of the dice to the leadframe, the dice and mounting paddles can be encapsulated in plastic, and the lead fingers trimmed to form the package leads.

Another type of leadframe is known as a lead-on-chip (LOC) leadframe. A LOC leadframe does not include mounting paddles for the dice. With a LOC leadframe, the lead fingers not only form the leads for the completed package, but also support the dice during the encapsulation process. Typical lead-on-chip (LOC) dice include bond pads formed along the center of the die. The dice can be attached directly to die attach areas on the lead fingers, and the bond pads on the dice wire bonded to bonding sites on the lead fingers.

Die attachment to the leadframe is designed to create a strong bond between the dice and the packages, the integrity of which can withstand subsequent processing and use in an electronic product. In addition, the material used for attaching the dice to the leadframe can serve other purposes such as heat transfer, and in some cases, electrical conductivity between the dice and lead fingers.

One conventional method of attaching dice to a leadframe is with polymer adhesives, such as epoxy and polyimide. Polymer adhesives are commercially available as viscous materials which can be deposited on the mounting paddles of the leadframe, such as by dispensing with a syringe, or screen printing. Using a die attach mechanism, each die can be positioned over a die attach area, then pressed onto the leadframe to form a thin adhesive layer between the die and the leadframe. Finally, the leadframe and die can be placed in an oven, to cure the adhesive at elevated temperatures in an inert atmosphere. Typical curing temperatures are from 150° C. to 275° C. for thirty minutes to one hour, in a nitrogen atmosphere.

For attaching LOC dice to a LOC leadframe, a double-sided adhesive tape can be used in place of a dispensed adhesive. The adhesive tape can include a thermoset adhesive on both sides, such as an epoxy, acrylic, silicone or polyimide. Such LOC tape is initially attached to the leadframe, and then to the faces of the dice using heat and pressure. Finally, the tape can be cured by subjecting the packages to elevated temperature in an oven.

Each semiconductor die has a thermal budget during processing and packaging, in that each die may only be subjected to a certain amount of heat without inducing thermal stresses. These thermal stresses can lead to loss of physical integrity or processing function in a die. It is generally accepted that the amount of heat to which dice are subjected during processing and packaging should be minimized. Thus, the use of heat curable adhesives for attaching semiconductor dice to leadframes during packaging are problematic. It would be advantageous to be able to attach semiconductor dice to leadframes without heating and introducing thermal stresses on the dice. It would also be advantageous to be able to attach semiconductor dice to leadframes at room temperature and ambient atmosphere.

The present invention is directed to a method and system for attaching semiconductor dice to leadframes, including LOC leadframes, without inducing thermal stresses on the dice. Still further, the present invention is directed to a method and system for attaching semiconductor dice to leadframes, including LOC leadframes, which can be performed in-line at room temperature, and ambient atmosphere with a high throughput.

SUMMARY OF THE INVENTION

In accordance with the present invention, an improved method for attaching semiconductor dice to leadframes, an improved semiconductor package, and a system for performing the method are provided. The method, simply stated, comprises: applying an instant curing adhesive to a portion of a leadframe; placing a semiconductor die in contact with the adhesive; and then polymerizing the adhesive at room temperature and ambient atmosphere to form a cured adhesive layer and bond the die to the leadframe.

Suitable instant curing adhesives include cyanoacrylate adhesives, and anaerobic acrylic adhesives. Commercial formulations of these adhesives can be modified to tailor the characteristics of the cured adhesive layer to electronics packaging. These characteristics can include improved mechanical strength, heat conductivity, moisture resistivity, and thermostablity. In addition, depending on the application, the instant curing adhesive can be formulated with an increased electrical conductivity or alternately with an increased dielectric strength.

Following curing of the adhesive, and bonding of the die to the leadframe, the die can be wire bonded to the leadframe and encapsulated in a polymer, and the leadframe trimmed to form a singulated semiconductor package. The semiconductor package comprises a trimmed portion of leadframe, the encapsulated semiconductor die, and the cured adhesive layer.

The method can be performed with a conventional lead frame having mounting paddles, or with a lead-on-chip (LOC) lead frame having lead fingers configured to support the die for packaging. With a conventional leadframe, the adhesive can include conductive fillers selected to improve the electrical conductivity and heat conductivity of the cured adhesive layer. With a LOC leadframe, the adhesive can include non-conductive fillers selected to increase the dielectric strength of the cured adhesive layer and prevent cross-talk between the lead fingers.

The system comprises: a dispensing mechanism for dispensing the instant curing adhesive on the leadframe; and a die attach mechanism for positioning and placing the die in contact with the dispensed adhesive. In the illustrative embodiment, the die attach mechanism comprises a conventional LOC die attacher modified to practice the invention.

BRIEF DESCRIPTION OF THE DRAWINGS

FIG. 3A is a schematic plan view of the semiconductor die illustrating an instant curing adhesive dispensed thereon in a dot pattern;

FIG. 3B is a schematic plan view of a mounting paddle of the leadframe illustrating an instant curing adhesive dispensed thereon in a linear pattern;

FIG. 4 is a schematic block diagram of a system adapted to perform the method outlined in FIG. 2;

FIG. 5 is a perspective view of a LOC leadframe and a LOC semiconductor die being attached in accordance with the method of the invention using an instant curing adhesive material; and FIG. 6 is a side elevation view of the LOC leadframe showing LOC semiconductor dice and associated adhesive layers prior to encapsulation and singulation.

DETAILED DESCRIPTION OF THE PREFERRED EMBODIMENT

Figures 1A, 1B, 2:
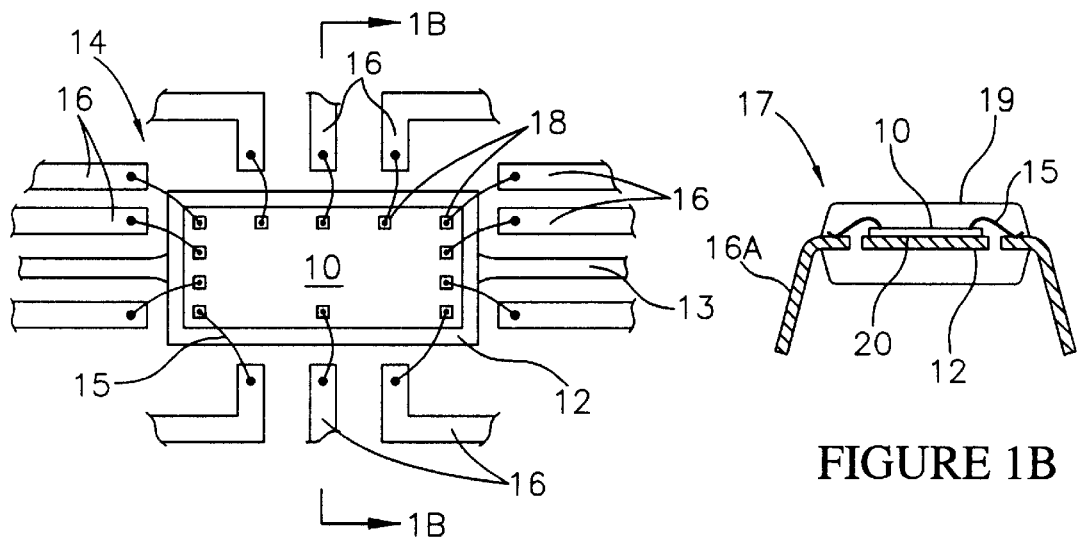
FIG. 1A is a schematic plan view with parts removed of a leadframe having a semiconductor die attached thereto in accordance with the invention.
FIG. 1B is a cross sectional view taken along section line 1B—1B of FIG. 1A illustrating a semiconductor package constructed in accordance with the invention.
FIG. 2 is a block diagram illustrating broad steps in the method of the invention.

Referring to FIG. 1A, a semiconductor die 10 is shown attached to a leadframe 14 in accordance with the method of the invention. The semiconductor die 10 includes a pattern of bond pads 18 in electrical communication with the integrated circuits contained on the die 10. The leadframe 14 comprises a conventionally formed metal leadframe having mounting paddles 12 and paddle support bars 13. In addition, the leadframe 14 includes an arrangement of lead fingers 16. Wires 15 are bonded to the bond pads 18 on the die 10, and to bonding sites on the lead fingers 16 to form separate electrical paths therebetween.

FIG. 1B illustrates a semiconductor package 17 after singulation from the lead frame 14. As shown in FIG. 1B, the package 17 includes the die 10, which has been attached to the mounting paddle 12 using a cured adhesive layer 20. Further details of the attachment process will be hereinafter described. The semiconductor package 17 also includes a plastic encapsulant 19, which encapsulates the die 10 and portions of the lead fingers 16A. Leads 16A for the package 17 comprise trimmed and formed portions of the lead fingers 16 (FIG. 1A).

Referring to FIG. 2, broad steps in a method for attaching the die 10 (FIG. 1A) to the leadframe 14 (FIG. 1B) to form the semiconductor package 17 (FIG. 1B) are illustrated. These broad steps include:

Providing a conventional semiconductor die and leadframe, step A.

Dispensing an instant curing adhesive material on the leadframe (or alternately on the die), step B.

Placing the die in contact with the adhesive material, step C.

Polymerizing the adhesive material to form a cured adhesive layer and bond the die to the leadframe, step D.

Step A can be performed using the conventional die 10 and leadframe 14 illustrated in FIG. 1A.

Step B is illustrated in FIGS. 3A and 3B. In FIG. 3A, adhesive material in the form of a pattern of circular adhesive dots 20A has been applied to a backside 21 of the semiconductor die 10 prior to placing the die 10 in contact with the mounting paddle 12. Alternately, as shown in FIG. 3B, adhesive material in the form of a pattern of elongated adhesive lines 20B has been applied to the mounting paddle 12. As is apparent, the patterns of dots 20A and lines 20B are merely exemplary and other patterns, including uniform and random patterns, can be employed.

The adhesive material can be applied by any suitable in-line dispensing mechanism including syringe dispensing, stenciling, dip coating, spraying, and dot shooting mechanisms.

A total volume of the adhesive material applied to the leadframe 12 (or to the die 10) is dependent on the size of the die 10 and a desired thickness of the cured adhesive layer 20 (FIG. 1B). A representative total volume of adhesive material for a 4.4 mm×9.4 mm die can be from 0.0025 grams to 0.0011 grams. The resultant adhesive layer 20 (FIG. 1B) can have a thickness of about 0.25 mils to 2 mils.

The adhesive material comprises an "instant curing adhesive". As used herein the term "instant curing adhesive" refers to an adhesive material formulated to form adhesive bonds at a temperature of between 20° C. to 30° C. within 0.25 seconds to 60 seconds, and at ambient atmosphere. As used herein a "cured" material refers to a material wherein from 90% to 100% of the material has polymerized.

Suitable instant curing adhesives materials include cyanoacrylate adhesives and anaerobic acrylic adhesives. A preferred instant curing adhesive material comprises a cyanoacrylate adhesive. In general cyanoacrylate adhesives are surface activated in that curing results from polymerization due to a catalytic interaction with the bonded surfaces. Adhesive stabilizers within the material can be used to stop polymerization at a desired thickness, or gap between the bonded surfaces.

The cyanoacrylate adhesive can be in the form of a monomer having the following general formula:

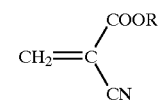

wherein R is a hydrocarbon group, for example an alkyl such as $C_nH_{2n+}1$. Suitable cyanoacrylate adhesives are commercially available from Loctite Corporation, Rocky Hill, Conn. under the trademarks "410" or "416".

In general, the "410" and "416" cyanoacrylate adhesives are not formulated for electronics packaging. Accordingly, they must be modified with various other constituents and fillers to improve the thermal conductivity, mechanical strength, electrical conductivity, dielectric strength, moisture resistivity, thermostability, or other characteristics of the adhesive layer 20 (FIG. 1B) for a particular electronics packaging application.

Representative fillers for improving thermal conductivity include $SiO_2$, $Al_2O_3$, AlN, Ag, Ni, and Fe. Representative fillers for improving mechanical strength include $SiO_2$ and SiC. Representative fillers for improving electrical conductivity include Ag, Ni and polystyrene coated Ni. Representative fillers for improving dielectric strength and thermostability include $SiO_2$.

In addition, one or more catalysts can be added to the cyanoacrylate adhesive, or applied to the dice 10 or mounting paddles 12, to accelerate the polymerization of the adhesive layer 20 (FIG. 1B). Suitable catalysts include weak acids and de-ionized (DI) water.

The method of the invention can also be practiced using an anaerobic acrylic adhesive. In general, anaerobic adhesives are fluids which cure in the absence of air but in the presence of metal by the free radical process. Typical anaerobic acrylic formulations are based on low molecular weight polyfunctional methacrylates. Representative formulations are disclosed in U.S. Pat. Nos. 4,309,526 and 4,295,909.

Immediately subsequent to the instant curing adhesive being dispensed on the mounting paddles 12, (or alternately on the die 10), the dice 10 can be placed in contact with the adhesive material. The dispensing (step B) and placing steps (step C) can be performed using a system 22, which is shown schematically in FIG. 4. The system 22 can include components of a conventional die attach machine configured for polymer bonding of dice to leadframes. One suitable die attach machine is manufactured by ESC Manufacturing Company of Ivy Land, Pa. and is designated a model no. 9200.

The system 22 can include a leadframe feed mechanism 42 for manipulating the leadframes 14, and a vacuum tool 44 for manipulating the dice 10. In addition, the system 22 can include a dispensing mechanism 46 for applying a desired volume of instant curing adhesive material to the mounting paddles 12 (FIG. 1A) of the leadframes 14.

The system 22 can also include an optical alignment device 48 for aligning the dice 10 to the mounting paddles 12. Still further, the system 22 can include a die support platform 50 for placing the dice 10 in contact with the mounting paddles 12 with a required pressure. Preferably this pressure can be in the range of 75 to 100 gm/die.

The polymerizing step (step D) occurs with the dice 10 placed in contact with the instant curing adhesive on the mounting paddles 12. With the adhesive sandwiched between the dice 10 and mounting paddles 12, a small amount of moisture contained on the mounting paddles 12 at ambient temperature, (i.e. condensed ambient humidity), can be sufficient to initiate anionic polymerization of the instant curing adhesive to form the cured adhesive layer 20 (FIG. 1B). Polymerization of the instant curing adhesive can be completed in from 0.25 to 60 seconds at an ambient temperature of from 20° C. to 30° C. In this manner, the semiconductor dice 10 can be bonded to leadframe 14 without heating the dice 10 or leadframe 14. The adhesive layer 20 (FIG. 1B) formed in this manner is sufficiently strong to withstand use in electronic equipment.

Referring to FIG. 5, the method of the invention can also be performed for attaching LOC dice 10A, to a LOC leadframe 14A. The LOC leadframe 14A includes generally parallel and spaced lead fingers 38 which will subsequently be trimmed and formed into package leads, substantially as previously described. The lead fingers 38 also function to support the dice 10A during subsequent wire bonding and encapsulation processes. In addition to the lead fingers 38, the LOC leadframe 14A includes bus bars 32 for making electrical connections to bond pads 30 on the LOC dice 10A. The LOC leadframe 14A is formed such that the lead fingers 38 and bus bars 32 form separate die mounting areas 36 for each LOC die 10A.

Using the previously outlined method an instant curing adhesive, such as a cyanoacrylate adhesive or an anaerobic acrylic adhesive, can be applied to the lead fingers 38 in the die mounting areas 36. Preferably the instant curing adhesive includes an electrically insulating filler such as $SiO_2$. The insulating filler functions to increase the dielectric strength of the adhesive layers 20C (FIG. 6) and inhibits cross-talk between the lead fingers 38 in the completed package. In addition, a suitable catalyst, as previously described, can be added to the instant curing adhesive, or applied to the LOC dice 10A, to accelerate the polymerization process.

With the adhesive applied to the lead fingers 38, the LOC dice 10A can be placed in contact with the adhesive to form adhesive layers 20C (FIG. 6) and bond the LOC dice 10A to the LOC leadframe 14A. A conventional LOC die attach system can be modified to form a system for attaching the LOC dice 10A substantially as previously described with system 22. Suitable LOC die attach systems are commercially available from ESC Manufacturing Company, Ivy Land, Pa.

EXAMPLE 1

A cyanoacrylate adhesive monomer sold by Loctite Corporation, Rocky Hill, Conn. under the trademark "416" was applied as a pattern of dots to the mounting paddle of a copper leadframe. A total volume of the adhesive monomer was about 0.005 grams. A semiconductor die having a 3 mm×5.6 mm footprint was manually positioned upon the mounting paddle. Curing occurred within about 10 seconds to form an adhesive layer about 0.2 mils thick. The adhesion force of the resulting bond was measured to be about 1.7 kg. Application and curing of the adhesive was performed at a room temperature of between about 20° C. to 30° C.

EXAMPLE 2

A plurality of semiconductor dice having a footprint of 3 mm×5.6 mm were secured to separate mounting paddles of a copper alloy leadframe using a model no. 9200 die attacher from ESC Manufacturing Company, Warrington, Pa. Different cyanoacrylate adhesive monomers sold by Loctite Corporation, Rocky Hill, Conn. under the trademarks "410" and "416" were applied and cured at a room temperature of from 20° C. to 30° C. A total volume of adhesive was about 0.005 grams applied in various dot patterns to form adhesive layers about 0.2 mils thick. Both adhesives were found to cure in seconds with a bonding force of about 1.7 kg/die.

Thus the invention provides a method for attaching semiconductor dice to a leadframe, an improved semiconductor die, and a system for performing the method. Although preferred materials have been described, it is to be understood that other materials may also be utilized. As an example, although cyanoacrylate has been described as the instant curing adhesive, other instant curing adhesives, such as anaerobic, can also be utilized in accordance with the present invention. Furthermore, although the method of the invention has been described with reference to certain preferred embodiments, as will be apparent to those skilled in the art, certain changes and modifications can be made without departing from the scope of the invention as defined by the following claims:

We claim:

1. A semiconductor package comprising:

a portion of a leadframe;

a semiconductor die bonded to the portion of the leadframe; and an adhesive layer between the portion of the leadframe and the die configured to bond the die to the portion of the leadframe, the adhesive layer comprising a cyanoacrylate adhesive or an anaerobic acrylic adhesive formulated to cure in contact with the die at a temperature of about 20° C. to 30° C. and in an ambient atmosphere in less than about 60 seconds, and a filler selected to improve a dielectric strength of the adhesive layer in the package.

2. The semiconductor package of claim 1 wherein the filler comprises $SiO_2$.

3. The semiconductor package of claim 1 wherein the cyanoacrylate adhesive has a formula:

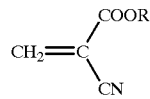

wherein R comprises a hydrocarbon group.

4. The semiconductor package of claim 1 wherein the portion of the leadframe comprises a mounting paddle and the die is bonded to the mounting paddle.

5. The semiconductor package of claim 1 wherein the leadframe comprises a lead-on-chip leadframe having a plurality of lead fingers and the die is bonded to the lead fingers.

6. The semiconductor package of claim 1 wherein the adhesive layer comprises a second filler selected from the group consisting of reinforcement fillers, catalyst fillers, heat conductive fillers, moisture resistance fillers and thermal stability fillers.

7. A semiconductor package comprising:
   a portion of a leadframe comprising a mounting paddle and a plurality of lead fingers;
   a semiconductor die attached to the mounting paddle; and
   an adhesive layer between the mounting paddle and the die attaching the die to the mounting paddle, the adhesive layer comprising a cyanoacrylate adhesive formulated to cure in contact with the die at a temperature of about 20° C. to 30° C. in an ambient atmosphere in less than about 60 seconds and having a formula:

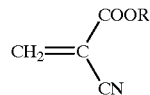

wherein R is a hydrocarbon group,
   and a filler configured to improve a thermal conductivity, a mechanical strength, a dielectric strength, a moisture resistivity, or a thermostability of the adhesive layer.

8. The semiconductor package of claim 7 further comprising a catalyst on the leadframe or the die configured to accelerate curing of the adhesive layer.

9. The semiconductor package of claim 7 wherein the filler comprises a material selected from the group consisting of $SiO_2$ and SiC.

10. A semiconductor package comprising:
    a portion of a lead-on-chip leadframe comprising a plurality of lead fingers;
    a semiconductor die attached to the lead fingers; and
    an adhesive layer attaching the die to the lead fingers, the adhesive layer comprising a cyanoacrylate adhesive or an anaerobic acrylic adhesive formulated to cure in contact with the die at a temperature of about 20° to 30° C. in an ambient atmosphere in less than about 60 seconds, and an electrically insulating filler configured to increase a dielectric strength of the adhesive layer.

11. The semiconductor package of claim 10 further comprising a catalyst on the leadframe or the die configured to accelerate curing of the adhesive layer.

12. The semiconductor package of claim 10 wherein the filler comprises $SiO_2$.

13. A semiconductor package comprising:
    a portion of a leadframe;
    a semiconductor die attached to the leadframe; and
    an adhesive layer attaching the die to the leadframe, the adhesive layer comprising an anaerobic acrylic adhesive formulated to cure in contact with the die at a temperature of about 20° C. to 30° C. in an ambient atmosphere in less than about 60 seconds, and a filler configured to improve a thermal conductivity, a mechanical strength, a dielectric strength, a moisture resistivity, or a thermostability of the adhesive layer.

14. The semiconductor package of claim 13 wherein the filler comprises a material selected from the group consisting of $SiO_2$ and SiC.

15. The semiconductor package of claim 13 wherein the portion of the leadframe comprises a mounting paddle and the die is attached to the mounting paddle.

16. The semiconductor package of claim 13 wherein the leadframe comprises a lead-on-chip leadframe comprising a plurality of lead fingers and the die is attached to the lead fingers.

17. The semiconductor package of claim 13 wherein the leadframe comprises a lead-on-chip leadframe comprising a plurality of lead fingers, the die is attached to the lead fingers and the filler comprises $SiO_2$.

18. A semiconductor package comprising:
    a leadframe;
    a semiconductor die attached to the leadframe; and
    an adhesive layer attaching the die to the leadframe, the adhesive layer comprising a cyanoacrylate adhesive formulated to cure in contact with the die at a temperature of about 20° C. to 30° C. in an ambient atmosphere in less than about 60 seconds.

19. The semiconductor package of claim 18 wherein the cyanoacrylate adhesive has a formula:

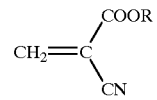

wherein R comprises a hydrocarbon group.

20. The semiconductor package of claim 18 wherein the cyanoacrylate adhesive includes a filler.

21. The semiconductor package of claim 18 wherein the cyanoacrylate adhesive includes a dielectric filler.

22. A semiconductor package comprising:
    a leadframe;
    a semiconductor die attached to the leadframe; and
    an adhesive layer attaching the die to the leadframe, the adhesive layer comprising an anaerobic acrylic adhesive formulated to cure in contact with the die at a temperature of about 20° C. to 30° C. in an ambient atmosphere in less than about 60 seconds.

23. The semiconductor package of claim 22 wherein the anaerobic acrylic adhesive includes a filler.

* * * * *